United States Patent [19]

Yerkes et al.

[11] 4,141,811
[45] Feb. 27, 1979

[54] PLASMA ETCHING PROCESS FOR THE MANUFACTURE OF SOLAR CELLS

[75] Inventors: John W. Yerkes, Granada Hills; James E. Avery, Burbank, both of Calif.

[73] Assignee: Atlantic Richfield Company, Los Angeles, Calif.

[21] Appl. No.: 899,760

[22] Filed: Apr. 24, 1978

[51] Int. Cl.$^2$ .................... C23C 15/00; H01L 31/06
[52] U.S. Cl. ................... 204/192 E; 136/89 R; 156/643
[58] Field of Search ............. 136/89 SG, 89 CC; 204/192 E, 164; 156/643; 29/572

[56] References Cited
U.S. PATENT DOCUMENTS

| | | | |
|---|---|---|---|
| 3,361,594 | 1/1968 | Iles et al. | 136/89 |
| 4,062,102 | 12/1977 | Lawrence et al. | 29/572 |

Primary Examiner—Aaron Weisstuch
Attorney, Agent, or Firm—Nilsson, Robbins, Dalgarn, Berliner, Carson & Wurst

[57] ABSTRACT

A process for manufacturing solar cells. Silicon wafers are assembled in a holding jig such as a diffusion boat in pairs with adjacent surfaces of each of the pairs in contact. The thus assembled wafers are subjected to a chemical vapor deposition diffusion step during which a phosphorous pentoxide glass layer is formed predominantly on the exposed surfaces and side edges of the wafers along with a PN junction thereunder. A small amount of the phosphorous pentoxide glass is also formed on the surfaces which are in contact with each other particularly at the outer edges thereof. The wafers are then reassembled in such a manner that the surfaces having the phosphorous pentoxide layer thereon are placed in contact with each other and again the wafers are placed in a holding jig. The thus assembled wafers are then placed in a plasma etching reactor for removal of the phosphorous pentoxide glass layer and the underlying PN junction from the side edges and the surfaces opposite the surfaces exposed during the previous diffusion step.

8 Claims, 7 Drawing Figures

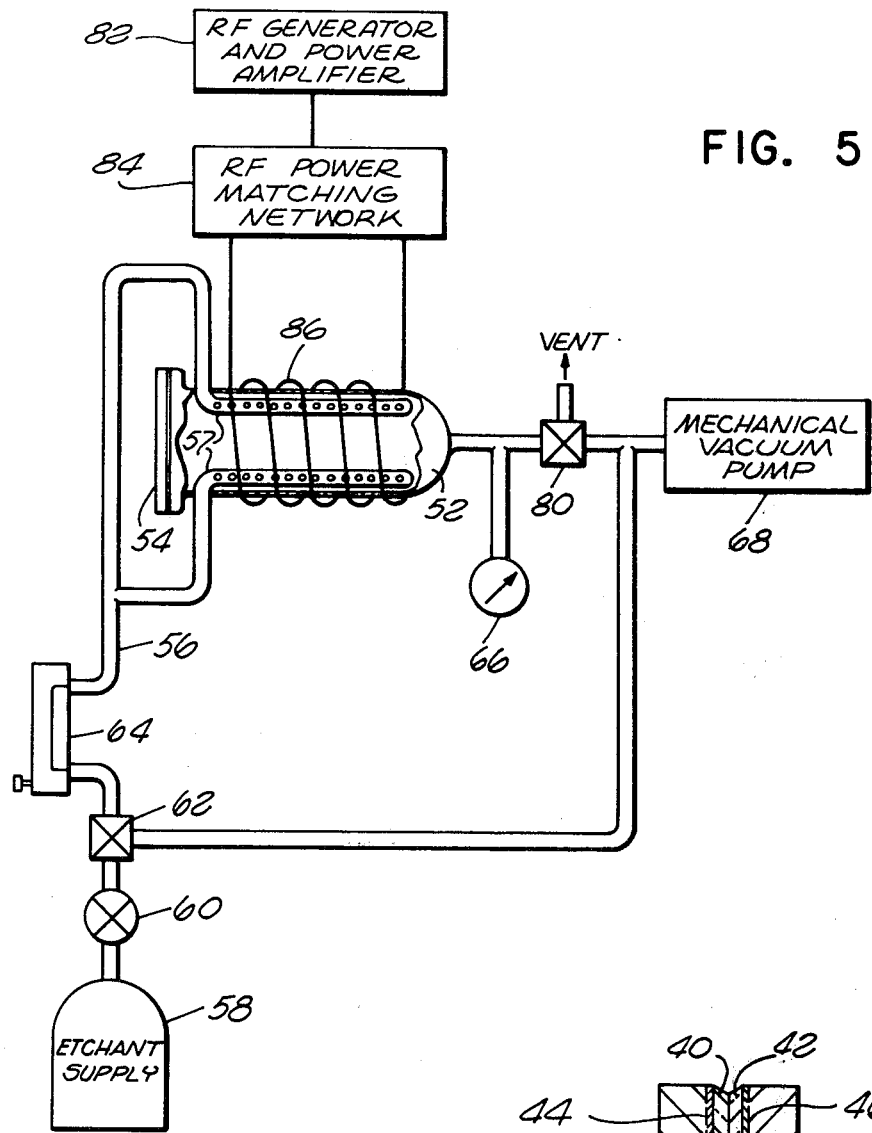
FIG. 5
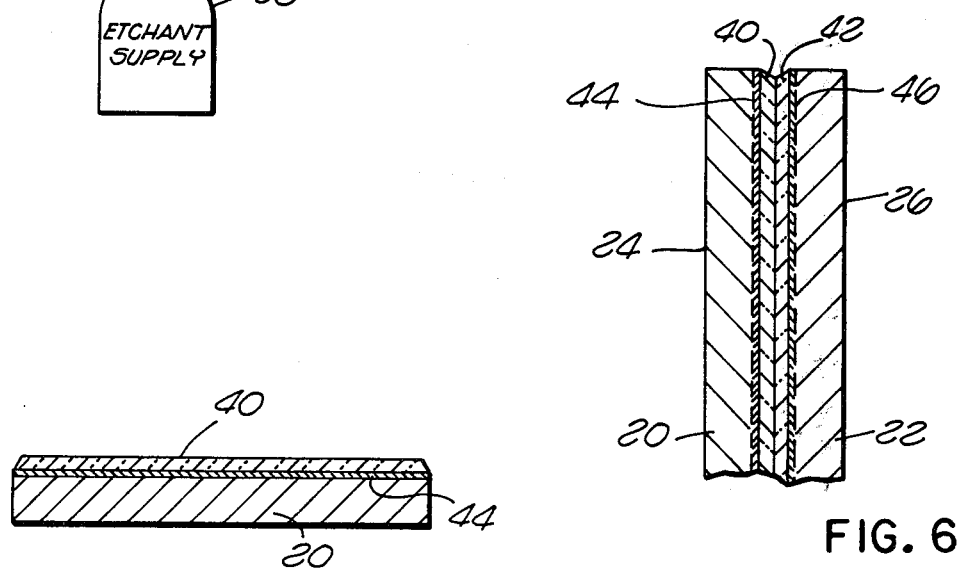
FIG. 7
FIG. 6

PLASMA ETCHING PROCESS FOR THE MANUFACTURE OF SOLAR CELLS

BACKGROUND OF THE INVENTION

Solar cells, normally to be operational, have very shallow PN junctions so that they may capture the blue end of the photo spectrum. Typically, the PN junction lies approximately 0.3 micrometers beneath the surface of the silicon semiconductor wafer. If, during the normal processing which occurs in the manufacture of solar cells subsequent to formation of the PN junction, the surface of the wafer in which the PN junction is formed is maltreated, the junction can be destroyed and the cell can become useless.

In forming the junction, the silicon semiconductor wafer is exposed at appropriate temperatures to a source of doping material selected to provide the desired PN junction. For example, in a boron doped, silicon semiconductor wafer which is a P conductivity type wafer, a layer of phosphorous pentoxide glass is deposited over the entire surface of the wafer through chemical vapor deposition by flowing phosphorus oxychloride and oxygen into the diffusion chamber using a carrier gas of dry nitrogen. The phosphorous pentoxide glass provides sufficient phosphorous atoms to diffuse from the glass into the silicon surface in accordance with well known diffusion characteristics to provide the desired shallow PN junction.

To form an operative solar cell, however, the layer of phosphorous pentoxide glass and the diffused N type layer of silicon must be removed from the silicon wafer except for one surface thereof so that appropriate contacts can be made to the wafer.

In the prior art, this undesired phosphorous pentoxide glass layer and the converted N type layer of silicon have been removed by acid etching utilizing a mixture of nitric acid and hydrofluoric acid. To protect the surface of the cell having the desired shallow junction therein, it has been customary to affix a mask, such as an acid etch resist mask, thereto. It has been found that the acid etch often penetrates pin holes or other irregularities in the mask, thus attacking the silicon wafer therebeneath and damaging portions of the junction. In the event the etch resist mask is effective to preclude undesirable etching, it must thereafter be removed with an appropriate solvent.

In an attempt to avoid the utilization of the etch resist mask, wafers have been affixed to a tape carrier having a proper adhesive on the surface thereof with the surface of the wafer to be protected affixed to the adhesive. Such obviously depends on the quality of the tape adhesive and furthermore, the tape in such systems can normally be used only once, thus injecting into the system an additional expense.

Irrespective of the type of masking technique which is utilized, the acid etch causes an exothermic reaction with silicon, thus creating heat which increases the temperature of the silicon wafer. As the temperature of the silicon wafer increases, the reaction rate between the acid etch and the silicon wafer also increases. Such phenomena obviously introduces parameters which must be carefully controlled to preclude a runaway etch from occurring.

In any acid etching technique there are severe problems relating to the undercutting of the silicon wafer by the acid etch. Those portions of the wafer immediately beneath the mask tend to be eaten away by the etch and undercut, thus tending to destroy the integrity of the junction and further providing access areas for the etch to reach across the surface of the wafer.

In an attempt to solve the foregoing problems a water jig etching technique was developed. Under this technique a water jet is caused to flow on the side of the wafer which is to be protected from the etch. The wet acid etch is applied then to the remainder of the wafer from which the glass and the converted silicon is to be removed. The water jet appears to preclude the etch from flowing around to the undesired portion of the wafer and also cools the wafer to thus control the etch rate. This system, however, requires a continuous water flow and a requirement to control the drainage of the resulting water-acid mixture.

In any of the systems utilizing the acid etch there is a requirement that the wafer be water rinsed and dried subsequent to the etching before any additional operations upon the wafer may be accomplished.

Plasma etching was introduced to overcome some of the foregoing difficulties. Plasma etching is, at this time, well known in the semiconductor processing art and is described in various publications. For example, U.S. Pat. No. 3,795,557 for PROCESS AND MATERIAL FOR MANUFACTURING SEMICONDUCTOR DEVICES, issued Mar. 5, 1974 which is incorporated herein by reference.

Plasma etching, though quite successful when properly controlled, nonetheless still introduced a number of problems. It was extremely difficult to obtain a cross-wafer uniformity, that is the nature and extent of the etching between two points on the same wafer was not always the same. In addition thereto, there were differences in the etching between two wafers in the same run of a plasma etching process. It was also found that differences occurred between two wafers which were run in different runs of the same etching process. It was determined that some of the causes for this non-uniformity in etching occurred as a result of variations in local temperature on the surface of the wafer during etching. The peculiar nature of the plasma etching process caused the elements which accomplished the etching to concentrate their energy on the wafer's periphery, thus overheating it. The overheating then in turn enhanced the etching, thus causing the peripheral regions of the wafer to become severely over-etched before the desired etching could be achieved along the surface of the wafer and particularly at the center thereof. To eliminate this difficulty, various steps have been taken in the plasma etching arts. These are to remove the wafers from the active plasma region, to limit the pressure of the plasma to less than 1 Torr, to lay the wafers on a conductive backing plate larger than the wafer itself or to place the wafers in a perforated metal cylinder during etching to shield the wafers from ions, radiation and electric fields, thus allowing only the free radicals to enter and contact the wafers.

Even though the plasma etching is a dry process, according to the prior art there is a requirement for a masking technique of some type to obtain the desired etching, particularly since the wafers are placed within the reaction chamber of the plasma etching apparatus, thus being fully exposed to the etchant contained therein. Thus one of the features causing wet etching to be undesirable is carried over to the plasma etching process as well.

SUMMARY OF THE INVENTION

The method of manufacturing solar cells which includes the steps of assembling silicon wafers of a first conductivity type in spaced apart pairs with adjacent first surfaces of each pair in contact and thereafter diffusing an active impurity into the wafers of an opposite conductivity imparting type to provide a PN junction therein. Reversing each of the pairs of wafers to bring those surfaces having the major portion of the diffusant therein into contact with each other and again assembling such pairs with these surfaces in contact and with the pairs being spaced apart. The thus reassembled pairs of diffused wafers are then plasma etched to remove the oppositive conductivity portion thereof from the first surfaces and from the edges thereof.

BRIEF DESCRIPTION OF THE DRAWINGS

FIG. 2 shows the wafers as assembled preparatory to and during the diffusion step, FIG. 3 shows the wafers at the conclusion of the diffusion step and FIG. 4 shows the wafers as assembled preparatory to the etching step;

FIG. 5 is a schematic diagram of a plasma etching apparatus;

FIG. 6 is a cross sectional view of a portion of a pair of wafers subsequent to the plasma etching step; and FIG. 7 is a cross sectional view of a semiconductor wafer subsequent to the plasma etching step.

DETAILED DESCRIPTION OF THE INVENTION

Figure 1:
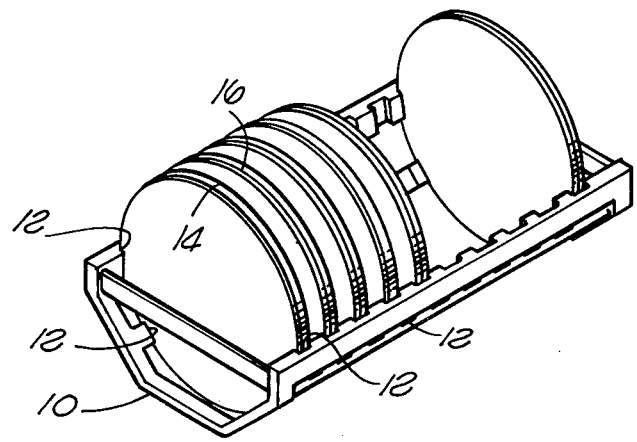
FIG. 1 is a perspective view of a plurality of pairs of silicon wafers assembled in a diffusion boat.

As is shown in FIG. 1 there is provided a typical diffusion jig or boat 10 constructed, for example, of quartz. The diffusion boat has a plurality of slots such as shown at 12 formed normally to receive a single wafer with appropriate space between wafers to allow the desired diffusion gases to totally surround the wafer during the diffusion process. The same type of structure can be utilized in carrying out the present invention.

The wafers are assembled into the boat 10 in pairs such as shown at 14 and 16. Through appropriate sizing of the slots 12 or by providing other mechanical means, the individual wafers comprising each of the pairs are assembled in such a fashion that adjacent first surfaces are maintained in close and intimate contact. Such contact is more clearly seen in FIG. 2 in which there is illustrated a pair of wafers 20 and 22 having first surfaces 24 and 26 thereof in contact with each other.

With the wafers 20 and 22 thus assembled, the contact between the surfaces 24 and 26 thereof functions as a diffusion mask. Although masking does occur in that the diffusion gases do not penetrate to provide an effective deposit of the diffusion material, some of the material does penetrate between the surfaces 24, 26 and thus there is some diffusion of active impurities into those surfaces (mostly at the outer edges). However, when compared to the amount of the phosphorous pentoxide glass deposited on the exposed surfaces 28 and 30 and the exposed edges 32 and 34, there is very little diffusion which occurs into the surfaces 24 and 26.

Figure 2:
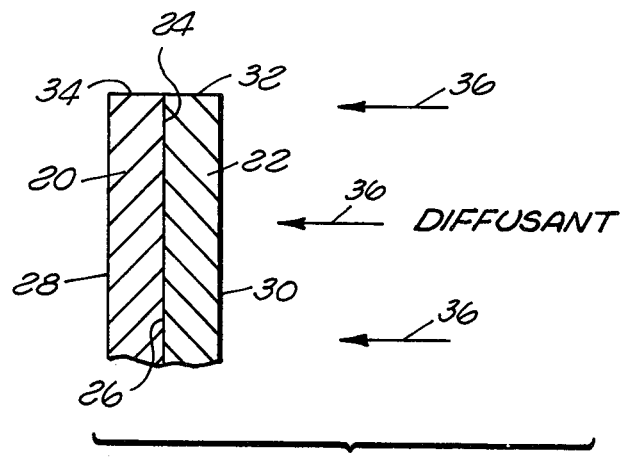
FIGS. 2 through 4 are cross sectional views of a portion of a pair of silicon semiconductor wafers at various stages in the manufacture thereof, specifically
Figure 3:
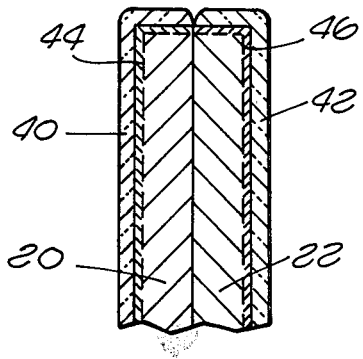

With the wafers arranged in pairs as above described, the boat 10 is then inserted into the diffusion furnace and a diffusant such as phosphorus oxychloride is caused to pass over the heated wafers as is represented by the arrows 36 of FIG. 2. The diffusion of active impurities into semiconductor wafers is well known to the art and a detailed description thereof is not required herein. After sufficient time has expired the wafers will then appear as illustrated in FIG. 3. As is therein shown, the wafers 20 and 22 have a layer of phosphorous pentoxide glass 40 and 42, respectively, thereon. The layers of glass 40 and 42, as illustrated in FIG. 3, extend over the exposed surfaces 28 and 30 as illustrated in FIG. 2 and the exposed peripheral edges 32 and 34. It is however noted that little or no glass is formed on the adjacent contacting surfaces 24 and 26. Thus as above pointed out the arrangement of the pairs of wafers with the adjacent first surfaces thereof in contact effectively functions as a mask to preclude substantial growth of the phosphorous pentoxide glass and subsequent junction formation in the contacting surfaces. By spacing the pairs of wafers apart as is illustrated in FIG. 1, the gaseous diffusant material is able to easily penetrate the spaces between the adjacent pairs of wafers to provide an adequate source of material to cover the exposed surfaces of the pairs of wafers to thereby provide the desired formation of the phosphorous pentoxide layers such as shown at 40 and 42 of FIG. 3.

Figure 4:
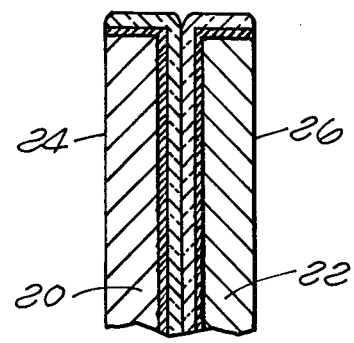

Subsequent to formation of the layers of phosphorous pentoxide glass and diffusion of the active impurity phosphorous therefrom into the wafers to form a PN junction as shown, for example, at 44, 46 therein, the wafers are removed from the boat 10. As illustrated in FIG. 4, the wafers are then reassembled by reversing the faces in contact with each other. Thus the faces of the wafers 20 and 22 bearing the phosphorous pentoxide layer 40 and 42, respectively are placed in contact with each other. The first surfaces previously in contact with each other, as shown at 24 and 26 of FIG. 2, are now exposed as illustrated in FIG. 4. The pairs of wafers thus rearranged are again inserted into the boat 10 and, as above indicated through arrangement of appropriate sized slots or with mechanical devices, the adjacent faces are brought into close and intimate contact. The boat with the wafers thus arranged therein is placed in the reaction chamber of a plasma etching apparatus. Such an apparatus is fully disclosed and described in U.S. Pat. No. 3,795,557 above referred to. However, for ease of description herein and assistance in complete disclosure such an apparatus is illustrated in FIG. 5 to which reference is hereby made. As is therein shown, in schematic form, the plasma etching apparatus includes a reactor chamber 52 typically made of quartz, having a cover 54 and a gas inlet manifold 56. The side of the reactor 52 has been partially broken away to better illustrate gas diffusion tubes 57 disposed therein and being externally connected to manifold 56.

The pressurized supply 58 of a binary gaseous mixture comprised of oxygen and a halocarbon gas is connected through a pressure regulating valve 60, a three way solenoid valve 62 and a flow meter 64 to manifold 56. A vacuum gauge 66 provides an indication of total reaction pressure in reactor 52. At any time, and prior to introduction of the gas mixture to manifold 56, the corresponding flow lines are constantly evacuated through the three way solenoid valve 62 leading to the mechanical vacuum pump 68. Such is also accomplished where air and atmospheric pressure prevails in reactor 52 through the utilization of a three way isolation valve 80. A source of radio frequency power 82 provides exciting energy through a matching network 84 to coil 86 which surrounds reaction chamber 52. The halocarbon utilized should be selected from the group of organohalides having no more than two carbon atoms per molecule and in which the carbon atoms are attached to a predominance of fluorine atoms. The preferred gaseous mixture is produced from a mixture containing approximately 8.5% by volume of oxygen and 91.5% tetrafluoro-methane gas.

Through the generation in the reaction chamber the fluorocarbon-based plasma reacts with the exposed phosphorous pentoxide and silicon material to combine therewith to thus etch such material as the etching occurs through this combination.

While in the reaction chamber 52 of the plasma etching apparatus the peripheral edges of the wafers with the phosphorous pentoxide layers formed thereon are etched more rapidly than is the exposed surface of the wafers. As above pointed out, such is even enhanced by the exothermic reaction which further heats the wafer. Thus there is clearly a non-uniform etching of the wafer with the more rapid etching occuring on the outer edges than on the flat surface thereof. It has further been found that the plasma etching of semiconductor wafers is such that the phosphorous doped silicon dioxide will be etched more quickly than does the boron doped silicon dioxide. As a result thereof, such further enhances the non-uniform etching of the silicon wafer formed as above described. To further enhance and speed up the etching process on the wafers formed as above described the boat bearing the wafers arranged as illustrated in FIG. 4 is placed at the center of the reaction chamber without any shielding, thereby being subjected to the maximum concentration of the plasma, and particularly the ions and free radicals contained therein.

Furthermore, by increasing the pressure within the reactor chamber 52 to approximately 20 Torr the etching process will be increased thereby increasing the through-put of the plasma etching apparatus. Upon completion of the plasma etching process the boat 10 constructed of aluminum, plastic or glass is removed from the reaction chamber 52 and the wafers contained therein will appear as illustrated in FIG. 6. As therein shown, the wafers 20 and 24 have the phosphorous pentoxide coating removed therefrom insofar as the peripheral edges and the surfaces 24 and 26 are concerned. Also removed from the surfaces 24 and 26 and the peripheral edges is any converted semiconductor material. However, beneath the layers of phosphorous pentoxide coated on the surfaces 28 and 30 as above described, the PN junction remains as shown at 44 and 46 and the layers 40 and 42 of phosphorous pentoxide also remain. Upon removal and disassembly the completed and etched device is as illustrated in FIG. 7 and includes the original boron doped P type wafer 20 having the coating of phosphorous pentoxide 40 thereon with the PN junction 44 formed therebeneath. The device thus formed is now ready for further and appropriate processing to apply the desired contacts to each of the surfaces thereof for future utilization as a solar cell.

It can thus be seen that by utilizing what has previously been considered to be deficiencies in the plasma etching process there results a number of distinct advantages, particularly when manufacturing solar cells in production quantities through utilization of the surfaces of the wafers as self-masks. It is readily apparent that twice as many wafers can be diffused at a time than as has previously been possible. This obviously reduces the amount of diffusant source material required by a substantial degree, thus further decreasing the cost of formation of the cell. Through utilization of the plasma etching the previous wet etching process is eliminated, thus eliminating additional steps of wetting and drying from the process and also eliminating the difficulty in handling the acid etch residue and pollutant material. Again through utilization of the self-masking, as above described, twice as many semiconductor wafers may be etched at a time in the plasma etching apparatus as compared to the previous utilization of the apparatus without any increase in surface area to be etched. Through utilization of the previously considered deficiencies in the plasma etching, the plasma etch times can be made much shorter and thus the through-put of the plasma etching apparatus can become higher. As a result of the shorter etching times and the plasma etch apparatus, less damage is also done to the surfaces of the wafers in which the PN junction has been formed.

It can thus be seen that through the utilization of the self-masking and dry etching techniques in the formation of solar cells in accordance with the present invention not only is there a dramatic cost reduction per unit but in addition thereto there is a dramatic reduction in the formation of pollutants through utilization of the wet acid-water etching techniques previously in existence.

What is claimed is:

1. The method of manufacturing solar cells comprising:
    assembling a plurality of silicon semiconductor wafers of a first conductivity type in spaced apart pairs with adjacent first surfaces of each pair in contact;
    diffusing an active impurity of an opposite conductivity imparting type into said wafers to provide a PN junction therein;
    reversing each pair of wafers with the opposite surfaces thereof in contact and with said first surfaces exposed and assembling said thus arranged wafers in spaced apart pairs; and
    plasma etching said thus assembled wafers to remove the opposite conductivity portion thereof from said first surfaces and edges thereof.

2. The method as defined in claim 1 wherein said diffusion is from a phosphorous source and a layer of phosphorous pentoxide glass is formed on said opposite surfaces of said wafers.

3. The method as defined in claim 2 wherein said semiconductor wafer is boron doped P type silicon.

4. The method as defined in claim 2 wherein said plasma etching step is performed with a mixture of tetrafluoromethane and oxygen.

5. The method as defined in claim 4 wherein said wafers are placed at the plasma center without shielding.

6. The method as defined in claim 1 wherein said wafers are plasma etched in a non-masked condition.

7. The method as defined in claim 1 which further includes the step of providing a holding jig for receiving said wafers in spaced apart pairs.

8. The method as defined in claim 7 wherein said holding jig includes a plurality of grooves, each of said grooves receiving a pair of said wafers.

* * * * *